(12) United States Patent
Harada et al.

(10) Patent No.: US 8,138,504 B2
(45) Date of Patent: Mar. 20, 2012

(54) SILICON CARBIDE SEMICONDUCTOR DEVICE AND METHOD OF MANUFACTURING THE SAME

(75) Inventors: Shin Harada, Osaka (JP); Takeyoshi Masuda, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 365 days.

(21) Appl. No.: 12/513,554

(22) PCT Filed: Nov. 7, 2007

(86) PCT No.: PCT/JP2007/071630
§ 371 (c)(1),
(2), (4) Date: May 5, 2009

(87) PCT Pub. No.: WO2008/056698
PCT Pub. Date: May 15, 2008

(65) Prior Publication Data
US 2010/0065857 A1     Mar. 18, 2010

(30) Foreign Application Priority Data

Nov. 10, 2006 (JP) ................... 2006-305476

(51) Int. Cl.
*H01L 29/15* (2006.01)
*H01L 21/20* (2006.01)
(52) U.S. Cl. ........... 257/77; 257/E29.084; 257/E21.054; 438/478
(58) Field of Classification Search ............ 257/77, 257/E29.084, E21.054; 438/478
See application file for complete search history.

(56) References Cited

U.S. PATENT DOCUMENTS

| | | | |
|---|---|---|---|
| 5,363,800 A | * | 11/1994 | Larkin et al. ............. 438/507 |
| 6,270,573 B1 | * | 8/2001 | Kitabatake et al. ............. 117/95 |
| 2003/0080384 A1 | * | 5/2003 | Takahashi et al. ............. 257/347 |
| 2005/0230686 A1 | | 10/2005 | Kojima et al. |

FOREIGN PATENT DOCUMENTS

EP          0 962 963 A1     12/1999
(Continued)

OTHER PUBLICATIONS

Starke et al., "SiC Surface Reconstruction: Relevancy of Atomic Structure for Growth Technology", Surface Review and Letters, vol. 6, No. 6, pp. 1129-1141 (1999).

*Primary Examiner* — Lex Malsawma
(74) *Attorney, Agent, or Firm* — Venable LLP; Michael A. Sartori; Leigh D. Thelen

(57) ABSTRACT

A silicon carbide semiconductor device having excellent performance characteristics and a method of manufacturing the same are obtained. A coating film made of Si is formed on an initial growth layer on a 4H—SiC substrate, and an extended terrace surface is formed in a region covered with the coating film. Next, the coating film is removed, and a new growth layer is epitaxially grown on the initial growth layer. A 3C—SiC portion made of 3C—SiC crystals having a polytype stable at a low temperature is grown on the extended terrace surface of the initial growth layer. A channel region of a MOSFET or the like is provided in the 3C—SiC portion having a narrow band gap. As a result, the channel mobility is improved because of a reduction in an interface state, and a silicon carbide semiconductor device having excellent performance characteristics is obtained.

6 Claims, 4 Drawing Sheets

FOREIGN PATENT DOCUMENTS

| | | |
|---|---|---|
| JP | 9-102459 | 4/1997 |
| JP | 11-162850 | 6/1999 |
| JP | 2000-294777 | 10/2000 |
| JP | 2003-234301 | 8/2003 |
| JP | 2004-152813 | 5/2004 |
| JP | 2005-97040 | 4/2005 |
| JP | 2005-277229 | 10/2005 |
| JP | 2006-13005 | 1/2006 |
| JP | 2006-344942 | 12/2006 |

\* cited by examiner

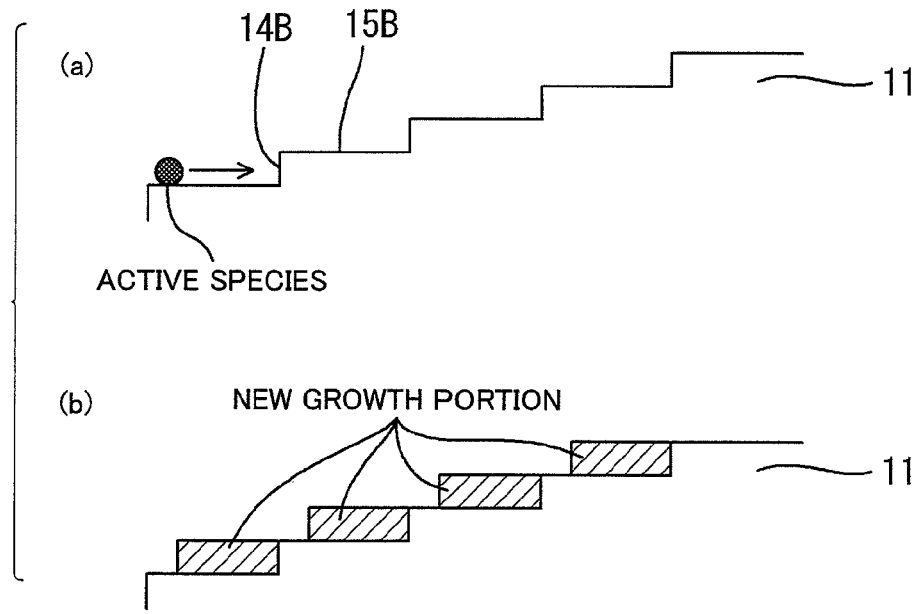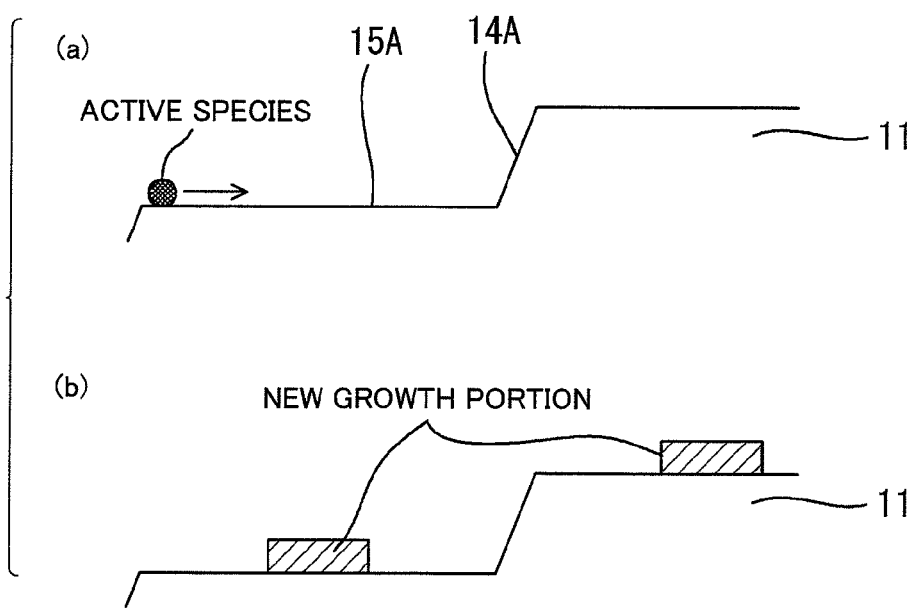

SILICON CARBIDE SEMICONDUCTOR DEVICE AND METHOD OF MANUFACTURING THE SAME

TECHNICAL FIELD

The present invention relates to a silicon carbide semiconductor device including an extended terrace portion and a method of manufacturing the same.

BACKGROUND ART

Semiconductor devices such as transistors or diodes formed by using a silicon carbide substrate (SiC substrate) where Si and C are bonded at a component ratio of 1:1 are expected to be put to practical use as power devices. Since silicon carbide is a wide band gap semiconductor and a breakdown electric field thereof is an order of magnitude higher than that of silicon, a high reverse breakdown voltage can be maintained even if the thickness of a depletion layer in a pn junction or a Schottky junction is reduced. Thus, the use of the silicon carbide substrate allows the thickness of the device to be reduced and a doping concentration to be increased. Therefore, it is expected that a low-loss power device having low on-resistance and high breakdown voltage will be realized.

There is a disadvantage that a MOSFET (Metal Oxide Semiconductor Field Effect Transistor) formed by using a silicon carbide substrate has lower mobility of carriers in a channel region (channel mobility) than that of a MOSFET formed by using a silicon substrate. This is mainly because a large amount of carbon remains in a thermal oxide film on the silicon carbide substrate intrinsically and a high interface state is created in a region near a boundary surface with the thermal oxide film of a silicon carbide layer. Furthermore, a substrate having a 4H or 6H polytype is used as the silicon carbide substrate, and in order to achieve smooth epitaxial growth, a substrate having a main surface offset at approximately 8° with respect to a {0001} surface is used. At a surface of the silicon carbide substrate having been annealed at a high temperature after dopant implantation, however, random irregularities exist. These irregularities cause the interface state density to be increased when the thermal oxide film as a gate insulating film is formed, and the thermal oxide film is also susceptible to carrier scattering caused by the irregularities at the surface.

As an art for alleviating the impact of the irregularities at the surface in the above-described silicon carbide substrate, Japanese Patent Laying-Open No. 2000-294777 (Patent Document 1) discloses an art for forming a channel region in a special terrace portion. After ion implantation to the silicon carbide substrate in order to form a diffusion region, annealing is performed at a high temperature, for example, to activate the dopant. Then, bunching steps are formed as a result of formation and buildup of steps and a flat terrace surface is formed between the bunching steps. In Patent Document 1, a region immediately under this flat terrace surface of the bunching steps is used as the channel region, so that the interface state caused by the irregularities at the surface is reduced and the carrier scattering caused by the irregularities at the surface is lessened.

Patent Document 1: Japanese Patent Laying-Open No. 2000-294777

DISCLOSURE OF THE INVENTION

Problems to be Solved by the Invention

In the silicon carbide substrate obtained by the method of Patent Document 1, however, it is difficult to reduce the irregularities at the surface to such an extent that the carrier mobility is substantially improved. The bunching steps obtained by annealing are formed as a result of reconstruction of the steps and only have a height of approximately several atomic layers. The terrace surface corresponding to a length of one cycle of the bunching steps also has a narrow width of approximately 10 nm. Therefore, the irregularities at the surface of the channel region still remain.

In addition, since hexagonal silicon carbide such as a 4H type or a 6H type widely used as a silicon carbide substrate has a wider band gap than cubic silicon carbide such as a 3C type, an interface state is more likely to be created in the channel region immediately under the gate insulating film. Therefore, relatively low channel mobility cannot be avoided.

In view of the facts that a wide flat terrace portion is grown under a certain condition and that a cubic silicon carbide layer is more likely to be epitaxially grown on a flat surface of a hexagonal silicon carbide layer, an object of the present invention is to provide a silicon carbide semiconductor device having excellent performance characteristics and a method of manufacturing the same by reducing irregularities at a surface of a channel region as well as improving the channel mobility due to a crystal structure.

Means for Solving the Problems

In a silicon carbide semiconductor device according to the present invention, a new growth layer is epitaxially grown on a base semiconductor layer made of hexagonal silicon carbide, and a channel region is formed in a portion located on an extended terrace surface in the new growth layer. The base semiconductor layer includes a silicon carbide substrate and a silicon carbide epitaxial layer epitaxially grown on the silicon carbide substrate.

As a result, cubic silicon carbide is epitaxially grown on the portion located on the flat extended terrace surface. A surface of the portion located on the flat extended terrace surface is also almost flat. Furthermore, cubic silicon carbide has less interface state in a region immediately under a gate insulating film than that of hexagonal silicon carbide. Therefore, the mobility of carriers in the channel region formed in the portion located on the extended terrace surface (channel mobility) is improved, so that a silicon carbide semiconductor device having excellent performance characteristics is obtained.

In particular, in a case where the base semiconductor layer is a 4H type silicon carbide layer having a main surface offset at not smaller than 2° with respect to the {0001} surface, a main surface of the extended terrace surface is the {0001} surface and a 3C type silicon carbide portion is epitaxially grown on the extended terrace surface. Therefore, the carrier mobility in the channel region is further improved.

Furthermore, since a direction in which the base semiconductor layer is offset is within ±7.5° with respect to a <1-100> direction, an orientation of each extended terrace surface is aligned. Therefore, the 3C type silicon carbide portion epitaxially grown on the extended terrace surface has excellent crystallinity. Thus, in addition to the further improvement in the carrier mobility in the channel region, the breakdown voltage property is improved.

The silicon carbide semiconductor device according to the present invention is applicable to both a lateral transistor and a vertical transistor. In the vertical transistor, in particular, a second conductivity type well region is formed from the portion located on the extended terrace surface in the new growth layer to reach the first conductivity type base semiconductor layer, so that a pn junction exists in the base semiconductor layer made of hexagonal crystals having a wide band gap. Therefore, a silicon carbide semiconductor device having the breakdown voltage maintained at a high level and having high channel mobility is obtained. In other words, the silicon carbide semiconductor device has a structure suited for power devices.

A method of manufacturing a silicon carbide semiconductor device according to the present invention is a method of: forming an extended terrace surface by heat-treating a base semiconductor layer of hexagonal crystals while providing silicon to the base semiconductor layer; epitaxially growing a new growth layer made of silicon carbide on the base semiconductor layer; and forming a channel region in a portion located on the extended terrace surface in the new growth layer.

With this method, a silicon carbide semiconductor device according to the present invention having high-level performance characteristics as described above is readily obtained.

In a case where a base semiconductor layer made of silicon carbide having a 4H polytype is used, a wide extended terrace surface is obtained by the foregoing heat treatment. Therefore, a 3C type silicon carbide having a cubic polytype is readily epitaxially grown on the extended terrace surface.

In the step of forming an extended terrace surface, a coating film including Si is formed on the base semiconductor layer, and then the base semiconductor layer is heat-treated at a temperature of not lower than a melting point of the coating film. As a result, a wide extended terrace surface can be readily formed.

Effects of the Invention

With a silicon carbide semiconductor device according to the present invention and a method of manufacturing the same, a silicon carbide semiconductor device having high channel mobility and excellent performance characteristics can be obtained.

BRIEF DESCRIPTION OF THE DRAWINGS

FIGS. 2(a) and (b) are diagrams of a growth mechanism in a case where, after an initial growth layer is grown, a new growth layer is further epitaxially grown without performing annealing with the initial growth layer covered with an Si film.

FIGS. 3(a) and (b) are diagrams of a growth mechanism in a case where, after the initial growth layer is grown, annealing is performed with the initial growth layer covered with the Si film, and then the new growth layer is epitaxially grown.

Figure 1:
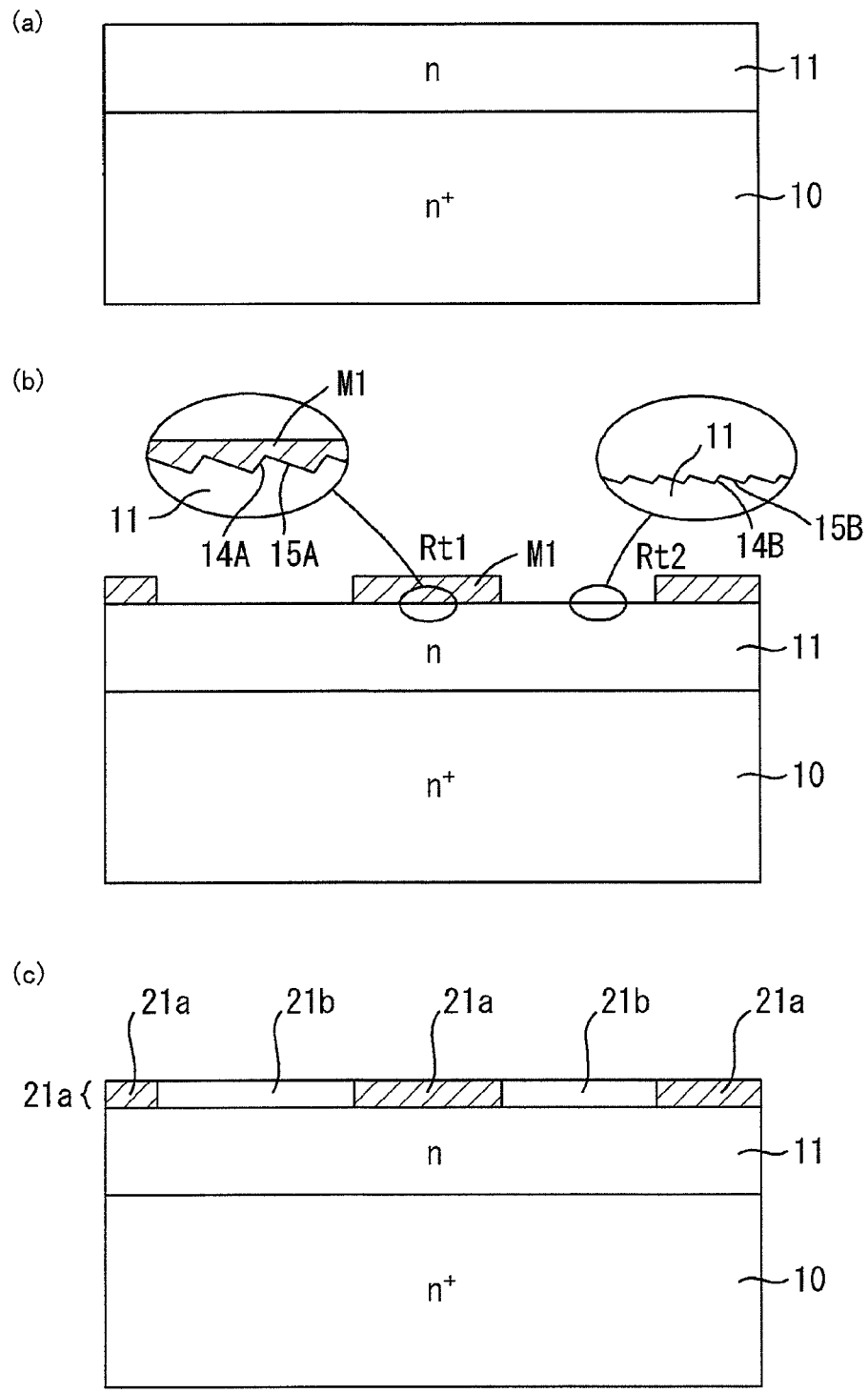
FIGS. 1(a)-(c) are cross-sectional views showing the step of forming an extended terrace surface and the step of forming a new growth layer that are common to first and second embodiments.

DESCRIPTION OF THE REFERENCE SIGNS 10 4H—SiC substrate, 11 initial growth layer (base semiconductor layer), 14A extended kink surface, 14B kink surface, 15A extended terrace surface, 15B terrace surface, 16 silicon oxide film, 21 new growth layer, 21a 3C—SiC portion, 21b 4H—SiC portion, 32, 52 p-well region, 32a, 52a channel region, 33 source/drain region, 37 carbon cap, 40 gate insulating film, 41 source/drain electrode, 42, 62 gate electrode, 43 drain electrode, 53 source region, 55 $p^+$ contact region, 60 back electrode, 61 source electrode, 63 drain electrode, M1 coating film

BEST MODES FOR CARRYING OUT THE INVENTION

The embodiments of the present invention will be described hereinafter with reference to the drawings, wherein the same or corresponding parts are represented by the same reference numerals, and the description thereof will not be repeated.

First Embodiment

Formation of Extended Terrace Surface

FIGS. 1(a)-(c) are cross-sectional views showing the step of forming an extended terrace surface and the step of forming a new growth layer that are common to first and second embodiments.

In a step shown in FIG. 1(a), an n-type 4H—SiC substrate 10 having a resistivity of 0.02 Ωcm and a thickness of 400 μm as well as using the {0001} surface offset at about 8° in the <1-100> direction as a main surface is prepared. Then, an initial growth layer (a base semiconductor layer) 11 having a thickness of about 10 μm and including an n-type dopant having a concentration of about $1 \times 10^{16}$ cm⁻ is epitaxially grown on 4H—SiC substrate 10 by using the CVD epitaxial growth method with in-situ doping. At this time, a surface portion of initial growth layer 11 includes many steps having relatively regular shapes, and a surface of each step includes a kink surface and a terrace surface. The terrace surface corresponds to the {0001} surface and has a width of approximately 10 nm. The kink surface corresponds to a {11-2n} surface (where "n" is any integer) or a {03-38} surface. When a 6H—SiC substrate is used, however, the terrace surface corresponds to the {0001} surface and the kink surface corresponds to a {01-14} surface. Many steps having somewhat regular shapes are formed at the surface of initial growth layer 11. A collection of these steps is called "bunching steps." It should be noted that the 6H—SiC substrate may be used instead of the 4H—SiC substrate. Furthermore, a layer having the bunching steps formed at a surface of a silicon carbide substrate itself by heat treatment or the like may be used as the base semiconductor layer.

Next, in a step shown in FIG. 1(b), an Si film covering initial growth layer 11 is deposited, and then is patterned to form a coating film M1 covering a device formation region. It should be noted that a region that is not covered with coating film M1 may be covered with a protective film such as a carbon cap. Then, annealing is performed under certain conditions, that is, at about 1500° C. for about two hours in an atmosphere of Ar. As a result, in a region Rt1 covered with coating film M1, an extended terrace surface 15A and an extended kink surface 14A created by extending the terrace surface and the kink surface of the bunching steps are formed (see a partial enlarged view of region Rt1). Although a mechanism for formation of such extended terrace surface has not yet been fully elucidated, empirical facts show that steps having extremely extended terrace surfaces and kink surfaces are formed by annealing while Si is provided. On the other hand, in a region Rt2 that is not covered with the coating film, there are a terrace surface 15B and a kink surface 14B that are hardly extended (see a partial enlarged view of region Rt2). Extended terrace surface 15A has been extended to have a width of approximately 0.1-50 μm. Although extended terrace surface 15A has been extended to be ten times or more wider than unextended terrace surface 15B, it is not drawn to scale in the partial enlarged view in FIG. 1(b) for convenience in illustration. The width of extended terrace surface 15A was measured by an SEM (Scanning Electron Microscope), an AFM (Atomic Force Microscope) or the like.

Although initial growth layer 11 is annealed at 1500° C. to form extended terrace surface 15A in the present embodiment, the annealing temperature here preferably has the following range. The annealing temperature is preferably not higher than 2545° C. in order to suppress sublimation and complete decomposition of SiC. The annealing temperature is preferably not higher than 2000° C. in order to suppress sublimation of SiC into $SiC_2$, Si or $Si_2C$ to some extent. The annealing temperature is preferably not higher than 1800° C. in order to sufficiently suppress sublimation of SiC into $SiC_2$, Si or $Si_2C$ and facilitate control over the surface morphology of initial growth layer 11. The annealing temperature is preferably not higher than 1600° C. in order to further improve the surface morphology of initial growth layer 11.

Although, at the time of annealing, Si is provided to the surface of initial growth layer 11 by covering initial growth layer 11 with coating film M1 made of Si in the present embodiment, other methods can be employed instead of this method. For example, the other methods include a method of flowing Si-based gas onto the surface of initial growth layer 11, a method of providing a liquid including Si to the surface of initial growth layer 11, a method of covering initial growth layer 11 with a coating film made of $SiO_2$, or the like, at the time of annealing.

Next, in a step shown in FIG. 1(c), coating film M1 is removed by using a mixture of nitric acid and hydrogen fluoride, and then a new growth layer 21 having a thickness of approximately 1 μm and including an n-type dopant having a concentration of about $1\times10^{16}$ $cm^{-3}$ is epitaxially grown on initial growth layer 11 by using the CVD epitaxial growth method with in-situ doping. This new growth layer 21 includes a 3C—SiC portion 21a grown on the region that was covered with the coating film, and a 4H—SiC portion 21b grown on the region that was not covered with coating film M1. In FIG. 1(c), although 3C—SiC portion 21a grows in a direction perpendicular to extended terrace surface 15A, and therefore 3C—SiC portion 21a and 4H—SiC portion 21b have an interface inclined with respect to the substrate surface, 3C—SiC portion 21a and 4H—SiC portion 21b are depicted as if they did not have the inclined interface for convenience sake. A growth mechanism of 3C—SiC having a polytype different from 4H—SiC on a region having extended terrace surface 15A will be described hereinafter.

FIGS. 2(a) and (b) are diagrams of a growth mechanism in a case where, after initial growth layer 11 is grown, new growth layer 21 is further epitaxially grown without performing annealing with initial growth layer 11 covered with the Si film. In other words, FIGS. 2(a) and (b) show a growth mechanism in 4H—SiC portion 21b shown in FIG. 1(c). As shown in FIG. 2(a), an active species (a compound including Si and C contributing to epitaxial growth) having reached the upper surface of narrow terrace surface 15B of the bunching steps moves on terrace surface 15B and immediately reaches kink surface 14B. Then, as shown in FIG. 3(b), information about the crystal structure of the base layer (initial growth layer 11) is passed on from kink surface 14B and a new growth portion made of 4H—SiC starts to be grown (step-flow growth). In a case of SiC crystals, since there are many polytypes, good-quality homoepitaxial growth is difficult on the {0001} surface having little kink surface. Therefore, an offset substrate having a main surface offset with respect to the {0001} surface is generally used.

FIGS. 3(a) and (b) are diagrams of a growth mechanism in a case where, after initial growth layer 11 is grown, annealing is performed with initial growth layer 11 covered with the Si film, and then new growth layer 21 is epitaxially grown. In other words, FIGS. 3(a) and (b) show a growth mechanism in 3C—SiC portion 21a shown in FIG. 1(c). As shown in FIG. 3(a), even when the active species having reached extended terrace surface 15A moves on extended terrace surface 15A, it is less likely to reach kink surface 14A. This is because terrace surface 15 of the bunching steps has a width P1 of approximately 10 nm, whereas extended terrace surface 15A has a width of not less than the order of submicron (not less than 0.1 μm and not more than 50 μm). Therefore, as shown in FIG. 3(b), before the active species reaches extended kink surface 14A, crystal growth starts from the upper surface of extended terrace surface 15A (two-dimensional nucleation). In this case, the information about the crystal structure of the base layer (initial growth layer) is not passed on. Therefore, the homoepitaxial growth is less likely to occur and a new growth layer made of 3C—SiC having a polytype stable at a low temperature starts to be grown.

—Process of Manufacturing MOSFET—

FIGS. 4(a)-(d) are diagrams showing a process of manufacturing a lateral MOSFET in the first embodiment.

Figure 4:
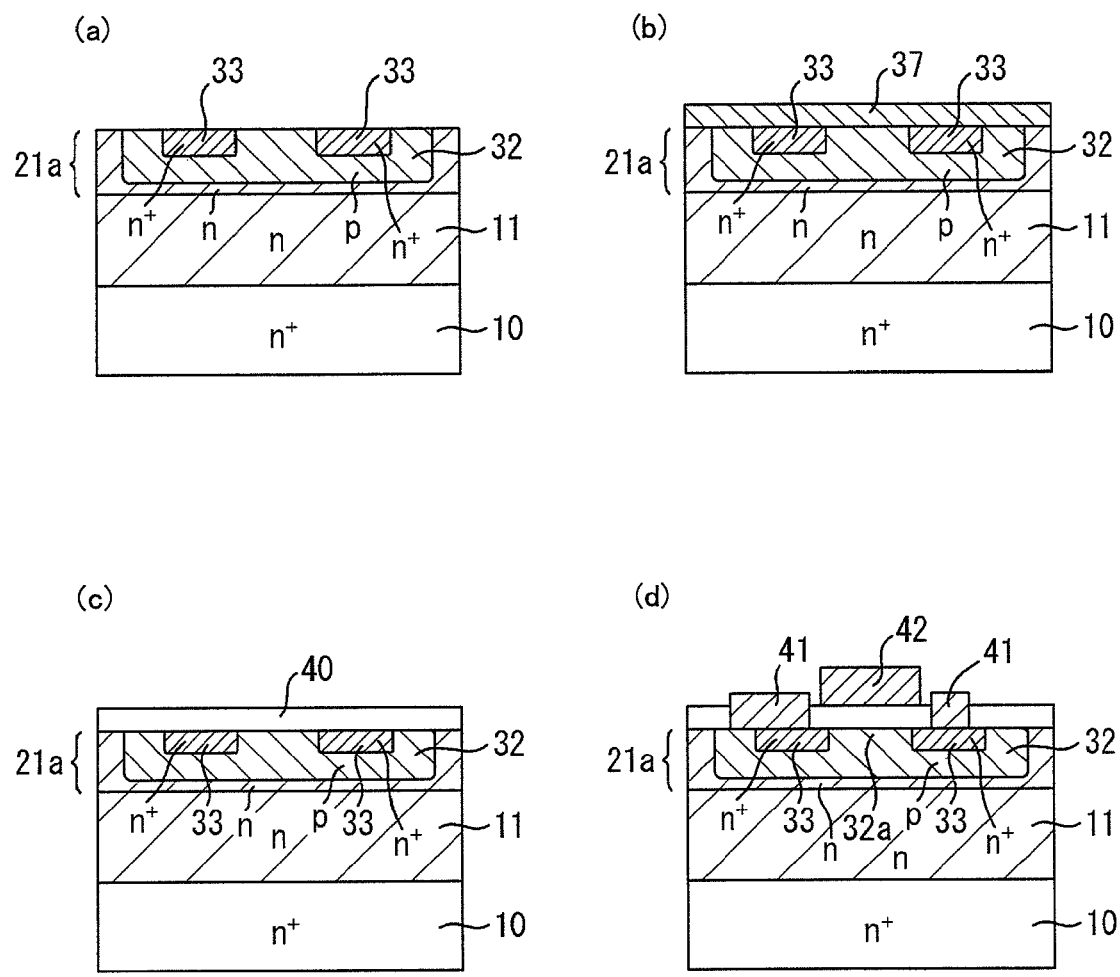
FIGS. 4(a)-(d) are diagrams showing a process of manufacturing a lateral MOSFET in the first embodiment.

In a step shown in FIG. 4(a), a p-well region 32 having a thickness (depth) of about 0.8 μm and including a p-type dopant having a concentration of about $1\times10^{17}$ $cm^{-3}$ is formed in a part of a surface portion of 3C—SiC portion 21a in new growth layer 21 by using the ion implantation method. Furthermore, a source region and a drain region 33 having a thickness (depth) of about 0.3 μm and including an n-type dopant having a concentration of $1\times10^{19}$ $cm^{-3}$ is formed in a part of a surface portion of p-well region 32, respectively, by using the ion implantation method. It should be noted that a lower end portion of p-well region 32 may reach the inside of initial growth layer 11 to form a pn junction in initial growth layer 11.

Next, in a step shown in FIG. 4(b), a positive-type resist having a thickness of 2.5-3 μm is applied on the entire substrate and heat treatment is performed under certain conditions, that is, at 750° C. for 15 minutes in an atmosphere of argon to form a carbon cap 37 having a thickness of 0.8-1 μm that covers the substrate. Thereafter, thermal annealing is performed under certain conditions, that is, at 1800° C. for 30 minutes in an atmosphere of argon with the substrate covered with carbon cap 37.

Next, in a step shown in FIG. 4(c), heat treatment is performed under certain conditions, that is, at 900° C. for 30 minutes in an atmosphere of oxygen to remove carbon cap 37. As a result, the entire surface of the substrate is smoothed to have a surface roughness Ra of approximately 1-2 nm. Thereafter, a gate insulating film 40 formed of a silicon oxide film and having a thickness of about 50 nm is formed on the substrate by the dry oxidation method in which the temperature of the substrate is maintained at about 1200° C. Although it is also possible that this annealing step with the substrate covered with the carbon cap is not performed, the annealing step is preferably performed in order to realize surface smoothness of a channel region.

It should be noted that, after removal of carbon cap 37, the surface portion of the substrate may further be removed by approximately 1-5 nm by CMP (Chemical Mechanical Polishing) with a polishing fluid including colloidal silica as a main component, so that the substrate surface may further be smoothed and planarized. In this case, a sacrificial oxide film (not shown) having a thickness of about 20 nm is formed on the substrate by heat treatment (the thermal oxidation method) under certain conditions, that is, at 1150° C. for 90 minutes in an atmosphere of oxygen, and then the sacrificial oxide film is removed by HF. As a result, a polishing strain layer (damaged layer) generated at p-well region 32 and source/drain region 33 by the CMP is removed.

Next, in a step shown in FIG. 4(d), a portion located on source/drain region 33 in gate insulating film 40 is opened, and then a source/drain electrode 41 formed of an Ni film and having a thickness of about 0.1 μm is formed, for example by using the lift-off method or the like, on the region where gate insulating film 40 is open. Thereafter, heat treatment is performed under certain conditions, that is, at 975° C. for two minutes in an atmosphere of argon, and a state of contact between Ni forming source/drain electrode 41 and silicon carbide forming the base layer (source/drain region 33) is changed from a Schottky contact to an ohmic contact. Furthermore, a gate electrode 42 made of Al is formed on gate insulating film 40 at a position spaced apart from source electrode 41.

According to the above-described manufacturing process, an n-channel type lateral MOSFET is formed. In this lateral MOSFET, a region located at the top of p-well region 32 and below gate electrode 42 with gate insulating film 40 interposed therebetween serves as a channel region 32a. Application of a voltage to gate electrode 42 when the MOSFET is on causes channel region 32a to be inverted, and a current corresponding to the voltage applied between source/drain regions 33 flows through channel region 32a. The mobility of electrons in this channel region 32a refers to the channel mobility.

In the present embodiment, channel region 32a is formed in 3C—SiC portion 21a, so that the mobility of carriers running through the channel when the MOSFET is on (the channel mobility) is improved. This is because cubic SiC such as 3C—SiC has a narrower band gap than hexagonal SiC such as 4H—SiC or 6H—SiC, and in the channel region located immediately under the gate insulating film, an interface state that prevents the carriers from running is low. In addition, the surface of 3C—SiC portion 21a of new growth layer 21 formed on the flat extended terrace surface is also flat, so that carrier scattering caused by the surface roughness is also suppressed. Therefore, the n-channel type MOSFET according to the present embodiment allows the channel mobility to be improved. Consequently, a silicon carbide semiconductor device having excellent performance characteristics such as having low on-resistance can be realized.

For example, the channel mobility of a lateral MOSFET having a channel region provided in a 4H—SiC layer is 5-10 (cm$^2$/V·s), whereas the channel mobility of the MOSFET according to the present embodiment having the channel region provided in 3C—SiC portion 21a is 70-100 (cm$^2$/V·s).

Furthermore, in the present embodiment, a diode such as a Schottky diode or a pn diode is formed in 4H—SiC portion 21b of new growth layer 21, although illustration is not given. Since cubic SiC such as 3C—SiC has a narrower band gap than that of hexagonal SiC such as 4H—SiC or 6H—SiC, the hexagonal SiC has a breakdown voltage superior to the cubic SiC. Therefore, according to the present embodiment, a lateral MOSFET having high speed performance characteristics and a diode having high breakdown voltage can be formed on the same substrate. A diode, however, does not necessarily have to be provided on the same substrate as a transistor.

Although an example in which the present invention is applied to the lateral MOSFET having the gate electrode formed on the substrate has been described in the first embodiment, the present invention is also applicable to a UMOSFET (that is also referred to as a trench MOSFET) having a gate electrode formed in a trench. In this case, only a central portion of 3C—SiC portion 21a in the first embodiment may be removed, for example by RIE, with 3C—SiC portion 21a remaining at side portions, to form a channel region in 3C—SiC portion 21a.

Second Embodiment

Steps of epitaxially growing initial growth layer 11 and new growth layer 21 on 4H—SiC substrate 10 in the present embodiment are the same as those described in the first embodiment (see FIGS. 1(a)-(c)). FIGS. 5(a)-(f) are cross-sectional views showing a process of manufacturing a DiMOSFET (Double Implanted Metal Oxide Semiconductor Field Effect Transistor) that is a silicon carbide semiconductor device in a second embodiment. The DiMOSFET according to the present embodiment serves as a power device having a double ion implanted layer to provide a high breakdown voltage performance. Although only two transistor cells of the DiMOSFET are shown in FIGS. 5(a)-(f), many transistor cells are combined to constitute one vertical DiMOSFET.

Figure 5:
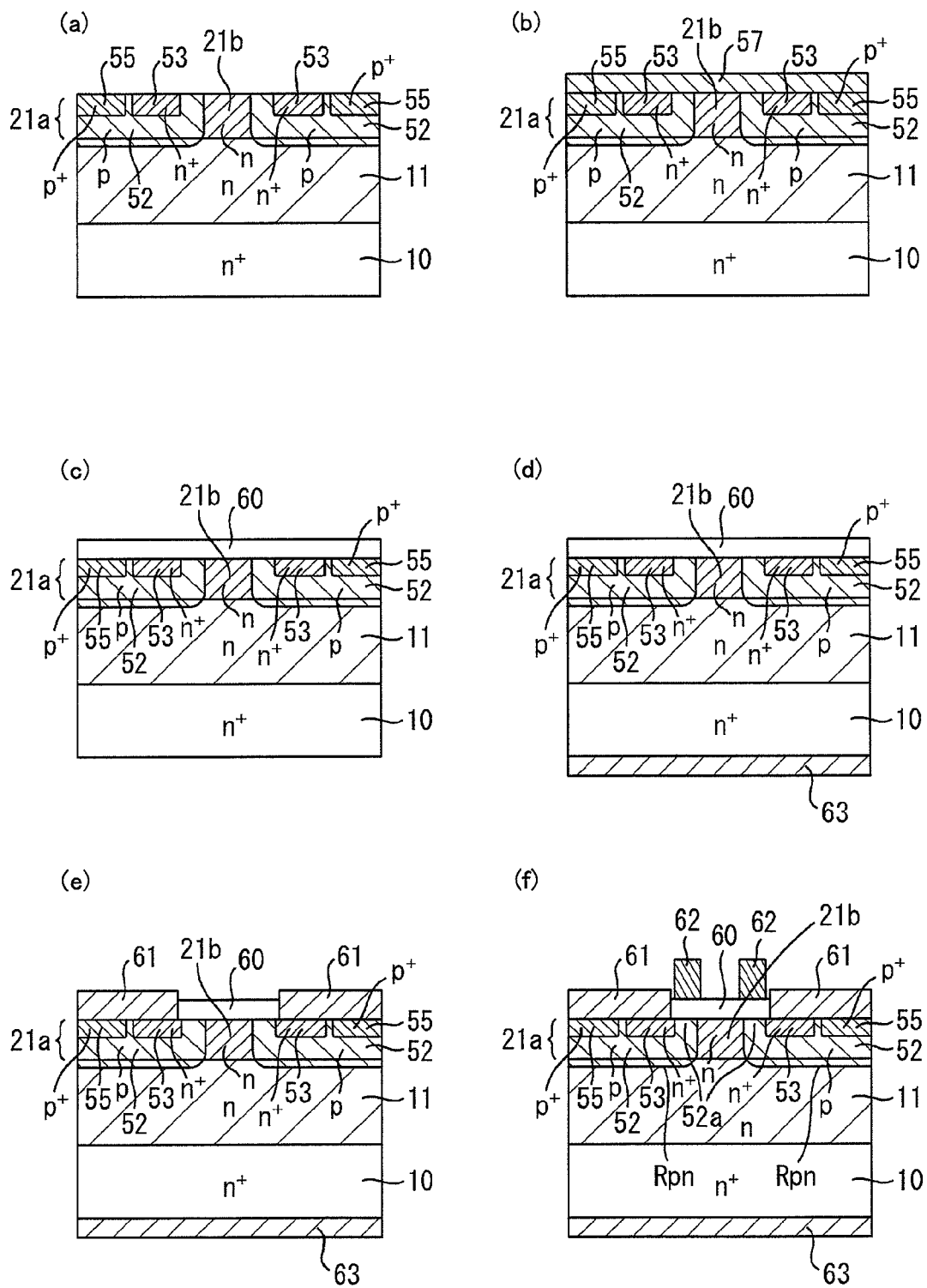
FIGS. 5(a)-(f) are cross-sectional views showing a process of manufacturing a DiMOSFET that is a silicon carbide semiconductor device in the second embodiment.

In a step shown in FIG. 5(a), a p-well region 52 having a thickness (depth) of about 1.2 μm and including a p-type dopant having a concentration of about $1 \times 10^{17}$ cm$^{-3}$ is formed in 3C—SiC portion 21a in new growth layer 21 and in a part of initial growth layer 11 by using the ion implantation method. At this time, for the reasons that will be described hereinafter, p-well region 52 is made thicker than 3C—SiC portion 21a to form a pn junction in initial growth layer 11. Furthermore, a source region 53 having a thickness (depth) of about 0.3 μm and including an n-type dopant having a concentration of $1 \times 10^{19}$ cm$^{-3}$ as well as a p$^+$ contact region 55 having a thickness (depth) of about 0.3 μm and including a p-type dopant having a concentration of $5 \times 10^{19}$ cm$^{-3}$ are formed in a part of a surface portion of p-well region 52, respectively, by using the ion implantation method. It should be noted that the temperature of the substrate at the time of ion implantation is all 500° C.

Next, in a step shown in FIG. 5(b), a positive-type resist having a thickness of 2.5-3 μm is applied on the entire substrate and heat treatment is performed under certain conditions, that is, at 750° C. for 15 minutes in an atmosphere of argon to form a carbon cap 57 having a thickness of 0.8-1 μm that covers the substrate. Thereafter, thermal annealing is performed under certain conditions, that is, at 1800° C. for 30 minutes in an atmosphere of argon with the substrate covered with carbon cap 57. As a result, the entire surface of the substrate is smoothed to have surface roughness Ra of approximately 1-2 nm.

Next, in a step shown in FIG. 5(c), heat treatment is performed under certain conditions, that is, at 900° C. for 30 minutes in an atmosphere of oxygen to remove carbon cap 57. Thereafter, a gate insulating film 60 formed of a silicon oxide film and having a thickness of about 50 nm is formed on the substrate by the dry oxidation method in which the temperature of the substrate is maintained at about 1200° C.

It should be noted that, after removal of carbon cap 57, the surface portion of the substrate may further be removed by approximately 1-5 nm by CMP (Chemical Mechanical Polishing) with a polishing fluid including colloidal silica as a main component, so that the substrate surface may further be smoothed and planarized. In this case, a sacrificial oxide film (not shown) having a thickness of about 20 nm is formed on the substrate by heat treatment (the thermal oxidation method) under certain conditions, that is, at 1150° C. for 90 minutes in an atmosphere of oxygen, and then the sacrificial oxide film is removed by HF. As a result, a polishing strain layer (damaged layer) generated at new growth layer 21 (3CSiC portion 21a), p-well region 52, source region 53, and p+ contact region 55 by the CMP is removed.

Next, in a step shown in FIG. 5(d), a drain electrode 63 formed of an Ni film and having a thickness of about 0.1 μm is formed on a back surface of 4H—SiC substrate 10 by the vapor deposition method, the sputtering method or the like.

Next, in a step shown in FIG. 5(e), a portion located on source region 53 and p+ contact region 15 in gate insulating film 60 is opened, and then a source electrode 61 formed of an Ni film and having a thickness of about 0.1 μm is formed, for example by using the lift-off method or the like, on the region where gate insulating film 60 is open.

Next, heat treatment is performed under certain conditions, that is, at 975° C. for two minutes in an atmosphere of argon, and a state of contact between Ni forming source electrode 61, drain electrode 63 and silicon carbide forming the base layer (source region 53, p+ contact region 55 and new growth layer 21a) is changed from a Schottky contact to an ohmic contact.

Next, in a step shown in FIG. 5(f), a gate electrode 62 made of Al is formed on gate insulating film 60 at a position spaced apart from source electrode 61.

According to the above-described manufacturing process, an n-channel type vertical DiMOSFET serving as a power device is formed. Many transistor cells are combined to constitute one vertical DiMOSFET although not shown in FIGS. 5(a)-(f). In each transistor cell of this vertical DiMOSEET, when the DiMOSFET is on, a current supplied from drain electrode 63 vertically flows through 4H—SiC substrate 10 and initial growth layer 11 to the top of 4H—SiC portion 21b, and then the current flows through channel region 52a at the top of p-well region 52 formed in 3C—SiC portion 21a to reach source region 53. Therefore, in channel region 52a, electrons serving as carriers run from source region 53 toward the top of 4H—SiC portion 21b. The mobility of the electrons in this channel region 52a refers to the channel mobility. Furthermore, a pn junction Rpn is formed in initial growth layer 11 made of 4H—SiC, not in 3C—SiC portion 21a.

In the present embodiment, channel region 52a is formed in 3C—SiC portion 21a similarly to the first embodiment, so that the mobility of the carriers running through the channel when the DiMOSFET is on is improved. The reason is as described in the embodiment. Therefore, the vertical DiMOSFET according to the present embodiment allows the channel mobility to be improved.

On the other hand, since cubic SiC such as 3C—SiC has a narrower band gap than that of hexagonal SiC such as 4H—SiC or 6H—SiC, the cubic SiC has a breakdown voltage inferior to the hexagonal SiC. In the present embodiment, pn junction Rpn is formed in initial growth layer 11 made of 4H—SiC, so that the breakdown voltage required for a power device can be maintained at a high level. In other words, the vertical DiMOSFET according to the present embodiment allows high channel mobility and high breakdown voltage to be realized at the same time.

Other Embodiments

A silicon carbide semiconductor device according to the present invention is not limited to the devices described in the first and second embodiments, but can have any variations in terms of a structure, a dimension, a dopant concentration, or the like of each portion as long as the device can produce the effects of the invention.

Although examples in which a silicon carbide semiconductor device according to the present invention is applied to a MOSFET have been described in the first and second embodiments, the silicon carbide semiconductor device according to the present invention is applicable to a device where a gate insulating film is an insulating film different from a silicon oxide film, for example a silicon nitride film, a silicon oxynitride film, other dielectric films of various types, or the like, that is, an MISFET in general. In addition, the silicon carbide semiconductor device according to the present invention is also applicable to an IGBT or the like.

A silicon carbide substrate that is one silicon carbide semiconductor substrate in the present invention is not limited to a 4H—SiC substrate, but may be a hexagonal SiC substrate having a polytype different from a 4H polytype, such as a 6H—SiC substrate.

INDUSTRIAL APPLICABILITY

A silicon carbide semiconductor device according to the present invention can be employed in an MISFET, an IGBT or the like used as a power device or a high-frequency device.

The invention claimed is:

1. A silicon carbide semiconductor device, comprising:
a base semiconductor layer made of hexagonal silicon carbide and having a surface that includes a part having an extended terrace surface and a remaining part having an unextended terrace surface, wherein said base semiconductor layer is a 4H type silicon carbide layer having a main surface offset at not smaller than 2° with respect to a {0001} surface;
an epitaxial layer formed on said base semiconductor layer, wherein the epitaxial layer includes a 3C type silicon carbide portion located on the extended terrace surface and a 4H type silicon carbide portion on the unextended terrace surface; and
a channel region formed in a portion located on said extended terrace surface in said epitaxial layer.

2. The silicon carbide semiconductor device according to claim 1, wherein
a direction in which said base semiconductor layer is offset is within ±7.5° with respect to a <1-100> direction.

3. The silicon carbide semiconductor device according to claim 1, further comprising:
a source region and a drain region provided on both sides of the channel region in the portion located on said extended terrace surface;
a gate insulating film formed on said channel region; and
a gate electrode formed on said gate insulating film, wherein
the silicon carbide semiconductor device serves as a lateral transistor.

4. The silicon carbide semiconductor device according to claim 1, wherein
said base semiconductor layer is a first conductivity type region,
the silicon carbide semiconductor device further comprises:
a second conductivity type well region formed from the portion located on said extended terrace surface to said base semiconductor layer;
a gate insulating film formed on said channel region;
a gate electrode formed on said gate insulating film;

a first conductivity type source region formed in said well region; and a first conductivity type drain region provided below said base semiconductor layer, and the silicon carbide semiconductor device serves as a vertical transistor.

5. A method of manufacturing a silicon carbide semiconductor device, comprising the steps of:
   (a) forming an extended terrace surface at a part of a surface of a base semiconductor layer made of hexagonal silicon carbide, by heat-treating said base semiconductor layer while providing silicon to said base semiconductor layer, and an unextended terrace surface at the remaining part of the surface of the base semiconductor layer, by heat-treating the base semiconductor layer without providing silicon to the remaining part of the surface of the base semiconductor layer; and
   (b) epitaxially growing a new growth layer made of silicon carbide on said base semiconductor layer, wherein the silicon carbide semiconductor device having a channel region in a portion grown on said extended terrace surface in said new growth layer, wherein the base semiconductor layer is made of 4H type silicon carbide, and wherein 3C type silicon carbide is epitaxially grown on a portion located on said extended terrace surface.

6. The method of manufacturing a silicon carbide semiconductor device according to claim 5, wherein
   said step (a) includes the sub-steps of
   (a1) forming a coating film including Si that covers at least a part of said base semiconductor layer, and
   (a2) heat-treating said base semiconductor layer at a temperature of not lower than a melting point of said coating film with said coating film applied.

* * * * *